United States Patent [19]
Beherns

[11] Patent Number: 5,572,558
[45] Date of Patent: Nov. 5, 1996

[54] PID LOOP FILTER FOR TIMING RECOVERY IN A SAMPLED AMPLITUDE READ CHANNEL

[75] Inventor: Richard T. Beherns, Louisville, Colo.

[73] Assignee: Cirrus Logic, Inc., Fremont, Calif.

[21] Appl. No.: 341,257

[22] Filed: Nov. 17, 1994

[51] Int. Cl.$^6$ ........................................................ H03D 3/24
[52] U.S. Cl. ............................ 375/376; 375/350; 375/355; 364/162; 364/724.01
[58] Field of Search ............................... 375/376, 350, 375/355, 375, 371, 373; 364/162, 724.01, 724.16, 724.17, 825; 331/17, 32; 360/65, 67

[56] References Cited

U.S. PATENT DOCUMENTS

| | | | |
|---|---|---|---|
| 3,741,474 | 6/1973 | Kawada et al. | 235/150.1 |
| 4,556,956 | 12/1985 | Dickenson et al. | 364/162 |
| 4,890,299 | 12/1989 | Dolivo et al. | 375/290 |
| 5,059,880 | 10/1991 | Hiroi | 364/162 |
| 5,223,778 | 6/1993 | Svarovsky et al. | 364/162 |
| 5,229,699 | 7/1993 | Chu et al. | 364/162 |
| 5,258,933 | 11/1993 | Johnson et al. | 364/602 |
| 5,309,484 | 5/1994 | McLane et al. | 375/355 |
| 5,359,631 | 10/1994 | Behrens et al. | 375/376 |

OTHER PUBLICATIONS

Cideciyan, Dolivo, Hermann, Hirt, Schott, "A PRML System for Digital Magnetic Recording", IEEE Journal on Selected Areas in Communication vol. 10, No.1, pp. 38–56, Jan. 1992.

Hong, Wood, Chan, "An Experimental 180 Mb/sec PRML Channel for Magnetic Recording", IBM Storage System Products Division, vol. 27, No. 6, Nov. 1991.

Primary Examiner—Stephen Chin
Assistant Examiner—Thuy L. Nguyen
Attorney, Agent, or Firm—Howard S. Sheerin

[57] ABSTRACT

A PID filter employed in a timing recovery phase-locked loop (PLL) for synchronizing the sampling of a read signal from a magnetic read head in a sampled amplitude read channel for magnetic recording. In addition to a proportional and integral term, the PID filter comprises a derivative term to decrease the settling time of the PLL by increasing the phase margin and damping. Consequently, the PLL locks onto the acquisition preamble in a shorter period thereby reducing the necessary preamble length and maximizing storage area for user data. The derivative term of the loop filter is disabled during tracking mode in order to attenuate noise in the phase error and to reduce gain variance associated with tracking arbitrary user data. The structure of the PID loop filter is transformed into an alternative structure in order to minimize the computation path latency between delay registers to avoid limiting the speed of the read channel. To defeat possible harmonic lock conditions caused by non-linearities in the phase-locked loop, a frequency error is added to the accumulation path (integrating path) of the PID filter. A further transformation provides better range and resolution for the PID filter coefficients.

19 Claims, 13 Drawing Sheets

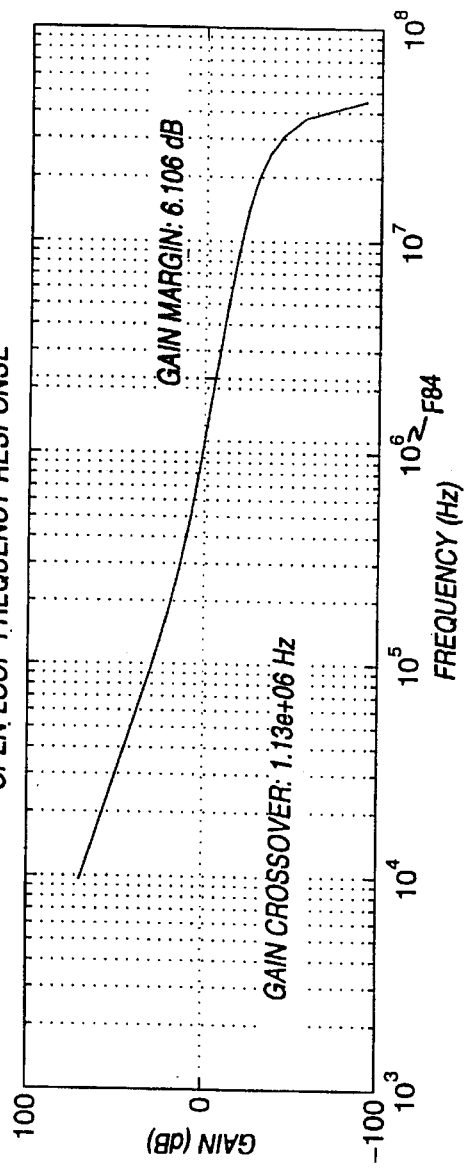
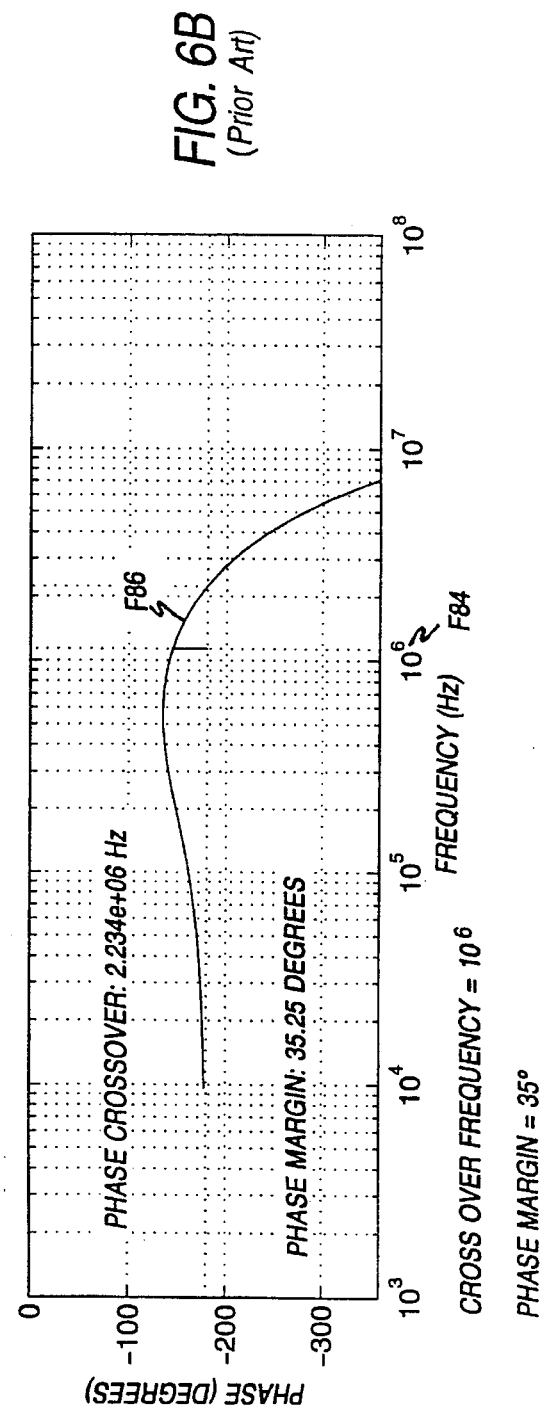

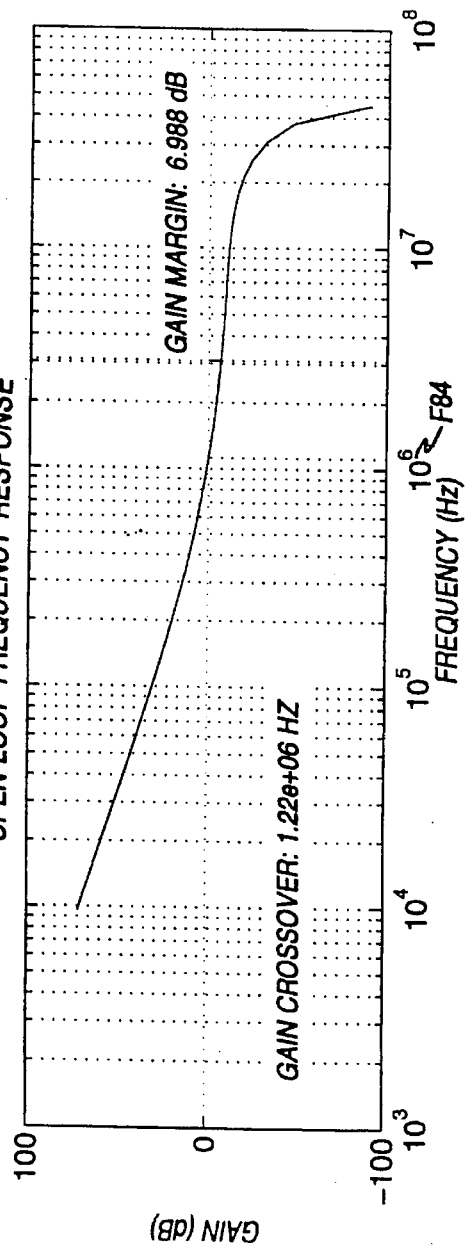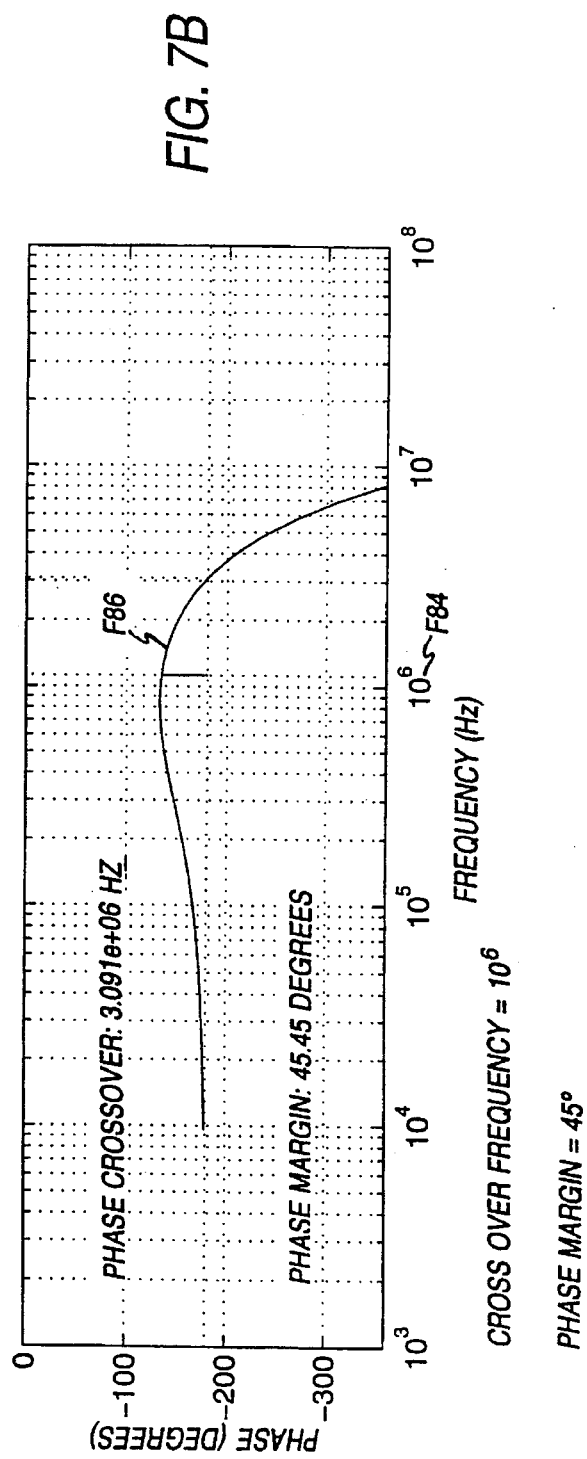

$h(n) = P+D, -D, I, I, I, ...$

PID LOOP FILTER FOR TIMING RECOVERY IN A SAMPLED AMPLITUDE READ CHANNEL

FIELD OF INVENTION

The present invention relates to the control of magnetic storage systems for digital computers, and particularly, to a sampled amplitude read channel that employs a PID loop filter for timing recovery.

CROSS REFERENCE TO RELATED APPLICATIONS AND PATENTS

This application is related to other co-pending U.S. patent applications, namely application Ser. Nos. 08/341,251 entitled "Sampled Amplitude Read Channel Comprising Sample Estimation Equalization, Defect Scanning, Channel Quality, Digital Servo Demodulation, PID Filter for Timing Recovery, and DC Offset Control," 08/012,266 entitled "Synchronous Read Channel," 08/236,719 entitled "Method and Apparatus for Calibrating a PRML Read Channel Integrated Circuit," and 08/313,491 entitled "Improved Timing Recovery For Synchronous Partial Response Recording." This application is also related to several U.S. patents, namely U.S. Pat. Nos. 5,359,631 entitled "Timing Recovery Circuit for Synchronous Waveform Sampling," 5,291,499 entitled "Method and Apparatus for Reduced-Complexity Viterbi-Type Sequence Detectors," 5,297,184 entitled "Gain Control Circuit for Synchronous Waveform Sampling," and 5,329,554 entitled "Digital Pulse Detector." All of the above-named patent applications and patents are assigned to the same entity, and all are incorporated herein by reference.

BACKGROUND OF THE INVENTION

In magnetic storage systems for computers, digital data serves to modulate the current in a read/write head coil so that a sequence of corresponding magnetic flux transitions are written onto a magnetic medium in concentric tracks. When reading this recorded data, the read/write head again passes over the magnetic medium and transduces the magnetic transitions into pulses in an analog signal that alternate in polarity. These pulses are then decoded by read channel circuitry to reproduce the digital data.

Decoding the pulses into a digital sequence can be performed by a simple peak detector in a conventional analog read channel or, as in more recent designs, by a discrete time sequence detector in a sampled amplitude read channel. Discrete time sequence detectors are preferred over simple analog pulse detectors because they compensate for intersymbol interference (ISI) and are less susceptible to noise. As a result, discrete time sequence detectors increase the capacity and reliability of the storage system. There are several well known discrete time sequence detection methods including discrete time pulse detection (DPD), partial response (PR) with Viterbi detection, maximum likelihood sequence detection (MLSD), decision-feedback equalization (DFE), enhanced decision-feedback equalization (EDFE), and fixed-delay tree-search with decision-feedback (FDTS/DF).

In conventional peak detection schemes, threshold crossing or derivative information, implemented in analog circuitry, is normally used to detect peaks in the continuous time analog signal generated by the read head. The analog read signal is "segmented" into bit cell periods and interpreted during these segments of time. The presence of a peak during the bit cell period is detected as a "1" bit, whereas the absence of a peak is detected as a "0" bit. The most common errors in detection occur when the bit cells are not correctly aligned with the analog pulse data. Timing recovery, then, adjusts the bit cell periods so that the peaks occur in the center of the bit cells on average in order to minimize detection errors. Since timing information is derived only when peaks are detected, the input data stream is normally run length limited (RLL) to limit the number of consecutive "0" bits.

Detection errors are also caused by intersymbol interference (ISI). Storage density is directly related to the number of pulses stored on the storage medium, and as the pulses are packed closer together in the effort to increase data density, they eventually interfere with each other resulting in intersymbol interference. This interference can cause a peak to shift out of its bit cell, or its magnitude to decrease, and result in a detection error. The ISI effect is reduced by decreasing the data density or by employing an encoding scheme to ensure that a minimum number of "0" bits occur between "1" bits. For example, a (d,k) run length limited (RLL) code constrains to d the minimum number of "0" bits between "1" bits, and to k the maximum number of consecutive "0" bits. A typical RLL (1,7) 2/3 rate code which encodes 8 bit data words into 12 bit codewords to satisfy the (1,7) constraint.

Sampled amplitude detection, such as partial response (PR) with Viterbi detection, allows for increased data density by compensating for intersymbol interference and increasing channel noise immunity. Unlike conventional peak detection systems, sampled amplitude recording detects digital data by interpreting, at discrete time instances, the actual value of the pulse data. A sampling device samples the analog read signal at the baud rate (code bit rate) and an equalizing filter equalizes the sample values according to a desired partial response. A discrete time sequence detector, such as a Viterbi detector, interprets the equalized sample values in context to determine a most likely sequence for the data (i.e., maximum likehood sequence detection MLSD). In this manner, the effect of ISI can be taken into account during the detection process, thereby decreasing the probability of a detection error. After processing a consecutive sequence of sample values, the sequence detector compensates for ISI and channel noise by selecting the most likely digital sequence associated with the sample values. This increases the effective signal to noise ratio and, for a given (d,k) constraint, allows for significantly higher data density as compared to conventional analog peak detection read channels.

The application of sampled amplitude techniques to digital communication channels is well documented. See Y. Kabal and S. Pasupathy, "Partial Response Signaling", *IEEE Trans. Commun. Tech.*, Vol. COM-23, pp. 921–934, Sept. 1975; and Edward A. Lee and David G. Messerschmitt, "Digital Communication", Kluwer Academic Publishers, Boston, 1990; and G. D. Forney, Jr., "The Viterbi Algorithm", *Proc. IEEE*, Vol. 61, pp. 268–278, Mar. 1973.

Applying sampled amplitude techniques to magnetic storage systems is also well documented. See Roy D. Cideciyan, Francois Dolivo, Walter Hirt, and Wolfgang Schott, "A PRML System for Digital Magnetic Recording", *IEEE Journal on Selected Areas in Communications*, Vol. 10 No. 1, January 1992, pp. 38–56; and Wood et al, "viterbi Detection of Class IV Partial Response on a Magnetic Recording Channel", *IEEE Trans. Commun.*, Vol. Com-34, No. 5, pp. 454–461, May 1986; and Coker Et al, "Implementation of PRML in a Rigid Disk Drive", *IEEE Trans. on Magnetics*, Vol. 27, No. 6, Nov. 1991; and Carley et al, "Adaptive Continous-Time Equalization Followed By FDTS/DF Sequence Detection", *Digest of The Magnetic Recording Conference*, Aug. 15–17, 1994, pp. C3; and Moon et al, "Constrained-Complexity Equalizer Design for Fixed Delay Tree Search with Decision Feedback", *IEEE Trans. on Magnetics*, Vol. 30, No. 5, Sept. 1994; and Abbott et al, "Timing Recovery For Adaptive Decision Feedback Equalization of The Magnetic Storage Channel", *Globecom'90 IEEE Global Telecommunications Conference* 1990, San Diego, Calif., Nov. 1990, pp.1794–1799; and Abbott et al, "Performance of Digital Magnetic Recording with Equalization and Offtrack Interference", *IEEE Transactions on Magnetics*, Vol. 27, No. 1, Jan. 1991; and Cioffi et al, "Adaptive Equalization in Magnetic-Disk Storage Channels", *IEEE Communication Magazine*, Feb. 1990; and Roger Wood, "Enhanced Decision Feedback Equalization", Intermag'90.

Timing Recovery

Similar to conventional peak detection systems, sampled amplitude detection requires timing recovery in order to correctly extract the digital sequence. Rather than process the continuous signal to align peaks to the center of bit cell periods, as in peak detection systems, sampled amplitude systems synchronize the sampling of the pulses. That is, timing recovery adjusts the sampling clock in order to minimize the error between the signal sample values and estimated sample values. A pulse detector or slicer determines the estimated sample values from the read signal samples. Even in the presence of ISI the sample values can be estimated and, together with the signal sample values, used to synchronize the sampling of the analog pulses in a decision-directed feedback system.

Normally, a phase-locked-loop (PLL) circuit controls the timing recovery in sampled amplitude detection. A phase detector generates a phase error based on the difference between the estimated samples and the read signal samples. A loop filter filters the phase error, and the filtered phase error operates to adjust the sampling clock which is typically the output of a variable frequency oscillator (VFO) with the filtered phase error as the control input. The output of the VFO controls the sampling clock of a sampling device such as an analog-to-digital (A/D) converter.

It is helpful to first lock the PLL to a reference or nominal sampling frequency so that the desired sampling frequency, with respect to the analog pulses representing the digital data, can be acquired and tracked more efficiently. The nominal sampling frequency is the baud rate, the rate that data was written onto the medium. Therefore, one method to lock-to-reference is to generate a sinusoidal signal relative to the write clock and inject this signal into the PLL. Once locked to the reference frequency, the PLL input switches from the write clock to the signal from the read head in order to synchronize the sampling of the waveform in response to a sinusoidal acquisition preamble recorded on the medium.

The acquisition and tracking modes for timing recovery are related to the data format of the magnetic disk. FIG. 2A shows a magnetic disk comprising a plurality of concentric data tracks 13 wherein each data track 13 is comprised of a plurality of sectors 15. Servo fields 17 are embedded into the sectors 15, and used to control and verify the track and sector position of the read/write head. FIG. 2B shows the format of a sector 15 comprising an acquisition preamble, a sync mark, and user data. The acquisition preamble is a predetermined sequence that allows timing recovery to acquire the desired sampling phase and frequency before reading the user data. After acquisition, the PLL switches to a tracking mode in order to track the desired sampling phase and frequency with respect to the analog pulses representing the user data. The sync mark signals the beginning of the user data. As illustrated in FIG. 2B, a short acquisition preamble is desirable so that there is more storage area for user data.

Prior techniques are known for acquiring and tracking the sampling frequency/phase based on the phase error (herein also referred to as timing gradient or stochastic gradient) computed from the actual signal samples and estimated signal samples obtained from symbol-by-symbol decisions. See "Timing Recovery in Digital Synchronous Receivers" by K. H. Mueller and M. Muller, IEEE Transactions on Communications, Vol. Com-24 (1976), pp. 516–531. Copending U.S. patent application Ser. No. 08/313,491 entitled "Improved Timing Recovery for Synchronous Partial Response Recording" discloses an improvement to the Mueller and Mueller stochastic gradient method. In this method of timing recovery a slicer, commonly employed in a d=0 PR4 partial response recording channel, estimates the sample values by comparing the signal sample values to predetermined thresholds. A stochastic gradient circuit, which minimizes the mean squared error between the signal sample values and the estimated sample values, generates the phase error to control the sampling clock.

U.S. Pat. No. 5,359,631 entitled "Timing Recovery Circuit for Synchronous Waveform Sampling" discloses yet another method for timing recovery in a sampled amplitude read channel. In this method a pulse detector, commonly employed in a d=1 EPR4 or EEPR4 partial response recording channel, operates to determine the estimated sample values. Again, a stochastic gradient circuit uses the estimated sample values, together with the signal sample values, to generate the phase error for adjusting the sampling clock in the decision-directed feedback system.

Timing Loop Filter

The loop filter controls the dynamics of the timing recovery phase-lock-loop (PLL). Accordingly, the loop filter coefficients are adjusted to achieve a desired transient response and tracking quality. For good tracking quality, the loop bandwidth should be narrow so that phase noise and gain variance is attenuated. During acquisition, the loop bandwidth should be as wide as possible without being unstable to achieve a fast transient response. A fast transient response results in a shorter acquisition time which minimizes the necessary length of the acquisition preamble. Again, a short acquisition preamble is desirable in order to increase the storage space available for user data.

The time necessary to acquire the acquisition preamble is a function of the step response of the PLL. The difference in phase between the sampling clock and the acquisition preamble read signal is a phase step input, and the difference in frequency is a frequency step input. Because the system is typically somewhat under-damped, the output of the PLL will oscillate around the desired acquisition phase as it converges. Eventually the phase and frequency error will remain within a predetermined maximum threshold. At that time, the PLL is effectively synchronized, both in phase and frequency, to the baud rate. This settling time to the desired maximum error determines the necessary length of the acquisition preamble. Therefore, the coefficients of the loop filter are adjusted in order to achieve an optimum transient response for fast acquisition and accurate tracking.

In conventional peak detection systems, analog circuits are normally used to implement the loop filter. Passive components, such as capacitors and resistors that are limited in precision and programmability, are used to implement the coefficients of the analog filter. Further, in analog systems the PLL dynamics do not change with data rates, and in magnetic disk storage systems the data rate increases from the inner diameter tracks to the outer diameter tracks. Therefore, the PLL must be able to lock onto a wide range of acquisition frequencies. This requires conventional peak detection timing loops to operate within a wide tolerance rather than at an optimum level.

In sampled amplitude read channels, timing recovery (including the timing loop filter) can be implemented with discrete time circuits. Discrete time circuits have desirable characteristics such as increased precision and range. Further, the coefficients of a discrete time filter can be easily adjusted to achieve a desired frequency response. Finally, the frequency response of a digital filter automatically scales to the varying data rates as the sampling frequency is adjusted between inner and outer diameter tracks of a magnetic disk. These characteristics provide greater control in attaining an optimum PLL transient response.

The prior art discrete time read channels use a digital filter with a proportional and integral term (PI controller). For example, William L. Abbott and John M. Cioffi, in "Timing Recovery for Adaptive Decision Feedback Equalization of the Magnetic Storage Channel", Globecom'90 IEEE Global Telecommunications Conference 1990, San Diego, Calif., Nov. 1990, pp.1794–1799, disclose a digital timing recovery loop filter of the form:

$$L(z)=A+B/(1-z^{-1}).$$

The integrating term $B/(1-z^{-1})$ learns the frequency offset, and the proportional term A stabilizes the negative feedback loop. Together, the proportional and integrating terms drive the steady state phase and frequency error to zero. Although this digital filter, having adjustable PI terms A and B, provides some control over the transient response of the phase-locked loop, even greater control is necessary to optimize the transient response yet further in order to decrease the settling time of the PLL and shorten the necessary length of the acquisition preamble. A higher order filter, therefore, is necessary to improve control over timing recovery.

A problem with higher order loop filters, however, is the resulting latency in the computation paths between delay registers which can limit the minimum sampling period and thereby limit the maximum speed of the read channel. For example, FIG. F9 shows a conventional PID loop filter which has, as its longest computation, a path through a multiplier F94, a first adder F96, a second adder F98, and a third adder F100. The latency in computing the multiplication and three additions can be the limiting factor in the minimum sampling period and overall speed of the read channel.

Yet another problem not resolved by the prior art is the possible harmonic lock conditions due to non-linearities of the phase-locked loop.

It is a general object of the present invention is to improve the timing recovery in sampled amplitude read channels for magnetic recording systems through the use of an improved phase-lock-loop discrete time filter. Specifically, an object is to decrease the necessary length of the acquisition preamble by providing greater control over the transient response of the phase-lock-loop. A further object is to minimize the computation path latency between delay registers of the filter while retaining adequate resolution over the coefficients. Yet another object is to programmably adapt the operation of the loop filter according to the varying characteristics of the storage system as well as the varying characteristics between tracks on a magnetic disk medium. A final object is to avoid harmonic lock conditions caused by non-linearities in the phase-lock-loop.

SUMMARY OF THE INVENTION

The objects of the present invention are achieved by incorporating into a sampled amplitude read channel a digital phase-lock-loop (PLL) comprising a variable frequency oscillator (VFO) to generate the sampling clock of a sampling device, such as an analog-to-digital converter (A/D), and a discrete time PID filter for controlling the dynamics of the loop. In addition to a proportional and integral term, the PID filter comprises a derivative term to decrease the settling time of the PLL by increasing the phase margin and damping. Consequently, the PLL locks onto the acquisition preamble in a shorter period thereby reducing the necessary preamble length and maximizing storage area for user data. The derivative term of the loop filter is disabled during tracking mode in order to attenuate noise in the phase error and to reduce gain variance associated with tracking arbitrary user data.

In the preferred embodiment, the conventional structure of the PID loop filter is transformed into an alternative structure in order to minimize the computation path latency between delay registers to avoid limiting the speed of the read channel. A further transformation provides better range and resolution for the PID filter coefficients.

To defeat possible harmonic lock conditions caused by non-linearities in the phase-locked loop, a frequency error is added to the accumulation path (integrating path) of the PID loop filter. The frequency error is computed from three read signal sample values spanning more than half a period of the sinusoidal acquisition preamble. In this manner, the frequency error is unaffected by a DC offset and has an increase in signal to noise ratio due to an increase in sensitivity.

BRIEF DESCRIPTION OF THE DRAWINGS

The above and other aspects and advantages of the present invention will be better understood by reading the following detailed description of the invention in conjunction with the drawings wherein:

FIG. 6A and 6B show the open loop frequency response of prior art PI timing recovery systems.

FIG. 7A and 7B show the open loop frequency response of the PID timing recovery system of the present invention and the effect of the derivative term.

DETAILED DESCRIPTION OF THE PREFERRED EMBODIMENT

Sampled Amplitude Recording Channel

Figure 1:
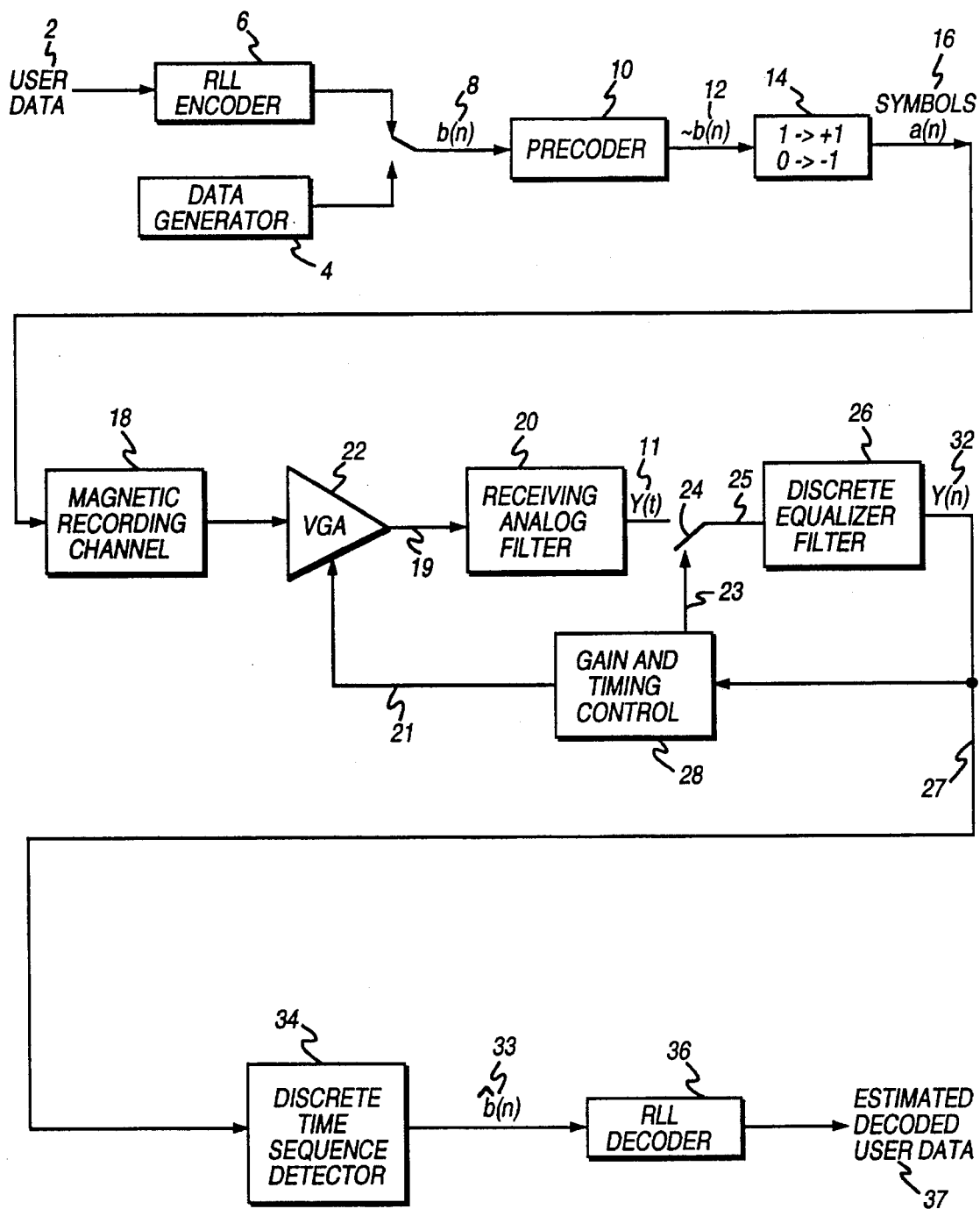
FIG. 1 is a block diagram of a conventional sampled amplitude recording channel.

FIG. 1 is a detailed block diagram of a conventional sampled amplitude read/write recording channel. During a write operation, either user data 2 or preamble data from a data generator 4 (for example 2T preamble data) is written onto the media. A RLL encoder 6 encodes the user data 2 into a binary sequence b(n) 8 according to an RLL constraint. A precoder 10 precodes the binary sequence b(n) 8 in order to compensate for the transfer function of the recording channel 18 and equalizing filters to form a precoded sequence ~b(n) 12. The precoded sequence ~b(n) 12 is converted into symbols a(n) 16 by translating 14 ~b(N)=0 into a(N)=−1, and ~b(N)=1 into a(N)=+1. The symbols a(n) 16 modulate the current in the recording head coil at the baud rate 1/T to record the binary sequence onto the magnetic media.

When reading the binary sequence back, a variable gain amplifier 22 adjusts the amplitude of the analog read signal 19, and an analog filter 20 provides initial equalization toward the desired response. A sampling device 24 samples the analog read signal Y(t) 11 from the analog filter 20, and a discrete time filter 26 provides further equalization toward the desired response. In partial response recording, for example, the desired response is often selected from Table 1.

The equalized sample values 32 are applied over line 27 to decision directed gain and timing control 28 for adjusting the amplitude of the read signal and the frequency and phase of the sampling device 24, respectively. Timing recovery adjusts the frequency of sampling device 24 over line 23 in order to synchronize the equalized samples 32 to the waveform (see co-pending U.S. patent application Ser. No. 08/313,491 entitled "Improved Timing Recovery For Synchronous Partial Response Recording"). Gain control adjusts the gain of variable gain amplifier 22 over line 21. The equalized samples Y(n) 32 are sent to a discrete time sequence detector 34, such as a maximum likelihood (ML) Viterbi sequence detector, to detect an estimated binary sequence b̂(n) 33. An RLL decoder 36 decodes the estimated binary sequence b̂(n) 33 into estimated user data 37. In the absence of errors, the estimated binary sequence b̂(n) 33 is equal to the recorded binary sequence b(n) 8, and the decoded user data 37 is equal to the recorded user data 2.

DATA FORMAT

Figure 2A:
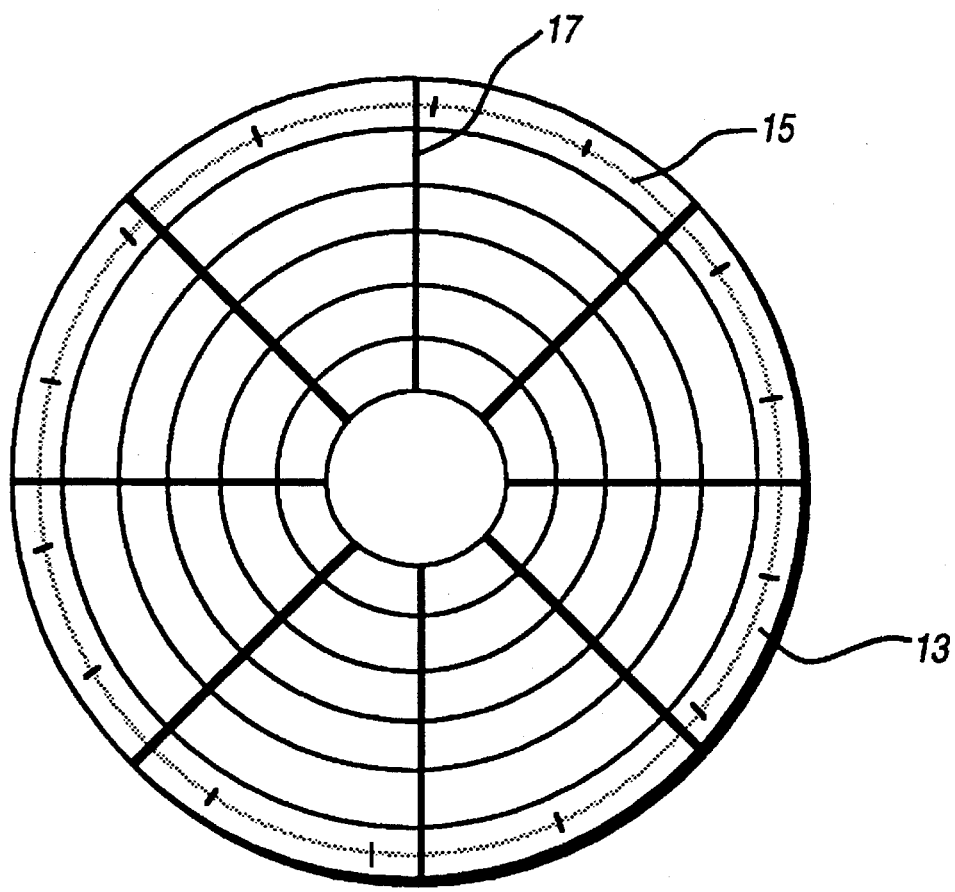
FIG. 2A shows an exemplary data format of a magnetic disk having a plurality of concentric tracks where each track contains a plurality of sectors.
Figure 2B:
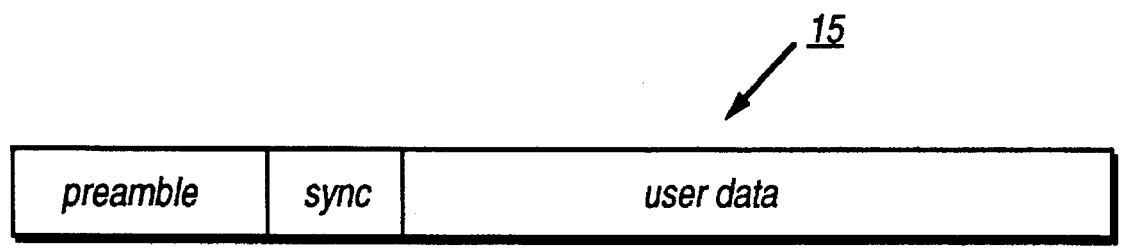
FIG. 2B shows an exemplary format of a sector.
Figure 3:
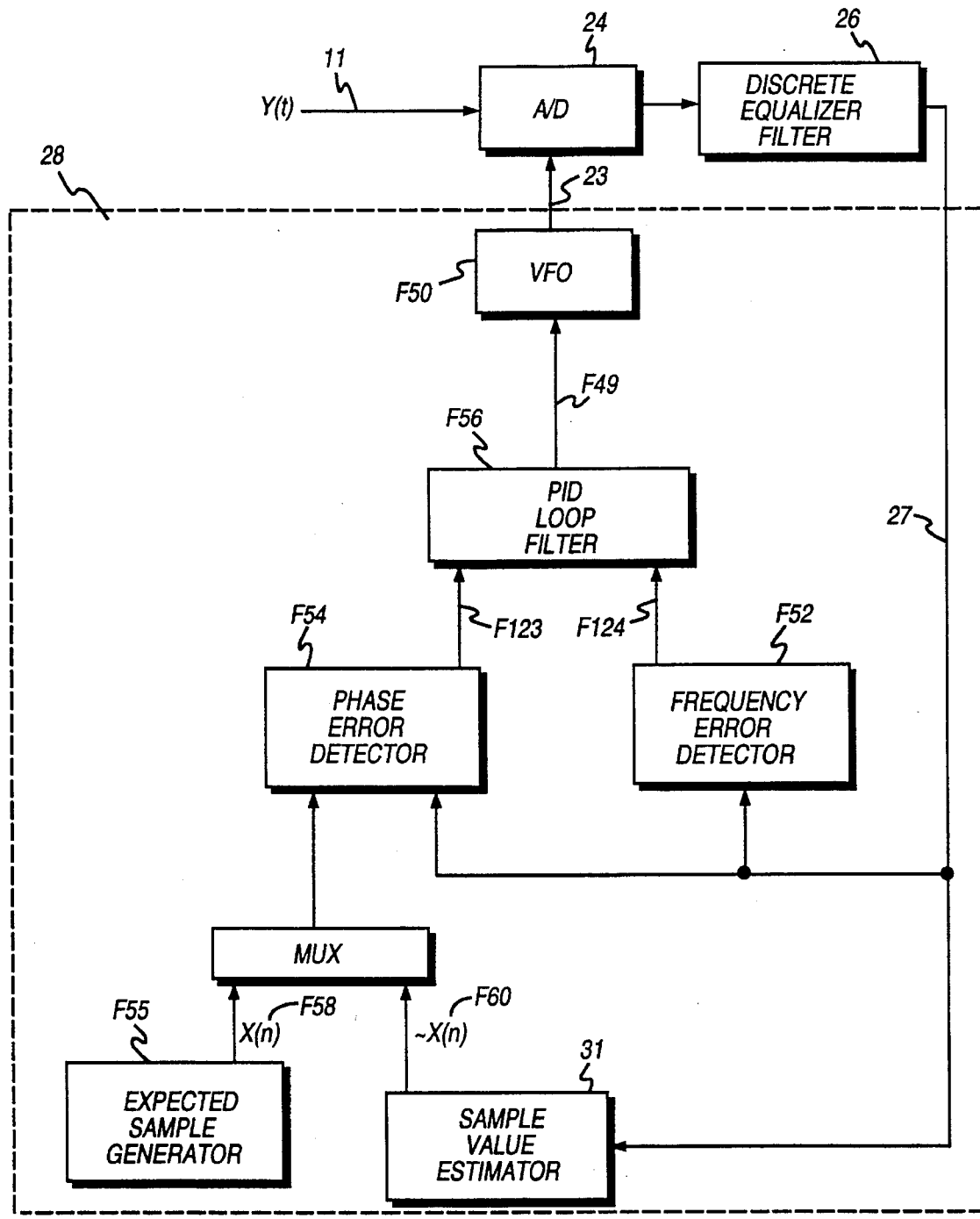
FIG. 3 is a block diagram of the timing recovery circuit of the present invention.

FIG. 2A shows an exemplary data format of a magnetic media comprising a plurality of concentric data tracks 13 wherein each data track 13 is comprised of a plurality of sectors 15, and wherein a plurality of servo fields 17 are embedded in the sectors. The servo fields 17 are processed to verify the track and sector position of the read/write head. Additionally, servo bursts within the servo field 17 are processed to keep the head aligned over the desired track 13 while writing and reading data. FIG. 2B shows the format of a sector 15 comprising a acquisition preamble, a sync mark, and user data. Timing recovery uses the acquisition preamble to acquire the correct sampling frequency and phase, and the sync mark signals the beginning of user data. See co-pending U.S. patent application Ser. No. 08/313,491 entitled "Improved Timing Recovery For Synchronous Partial Response Recording".

Timing Recovery

An overview of the timing recovery circuit 28 is shown in FIG. F3. The output 23 of a variable frequency oscillator (VFO) F50 controls the sampling clock of a sampling device 24 which is typically an analog-to-digital converter (A/D) in digital read channels. A frequency error detector F52 and phase error detector F54 control the frequency of the VFO F50, and a loop filter F56 provides control over the closed loop characteristics. From the sample values received over line 27, the frequency error detector F52 generates a frequency error F124, and the phase error detector F54 generates a phase error F123. The phase error F123 is also computed from expected sample values x(n) F58 from an expected sample generator F55 during acquisition and estimated sample values ~X(n) F60 from a sample value estimator F31, such as a slicer or a pulse detector, during tracking (see co-pending U.S. patent application Ser. No. 08/313,491 entitled "Improved Timing Recovery For Synchronous Partial Response Recording").

Referring again to FIG. 2B, before acquiring the acquisition preamble the phase-lock-loop first locks onto a predetermined nominal sampling frequency for the particular track. In this manner, the phase-lock-loop is close to the desired acquisition frequency when it switches to acquisition mode. As previously mentioned, the acquisition preamble is processed during acquisition mode in order to lock the PLL to the desired sampling phase and frequency before reading the user data field. Once locked onto the acquisition preamble, the phase-lock-loop switches into tracking mode and, after detecting the sync mark, begins tracking user data. Accordingly, an object of the invention is to lock the PLL to the acquisition preamble in the shortest period possible to minimize the length of the acquisition preamble and maximize storage space for user data.

Figure 11A:
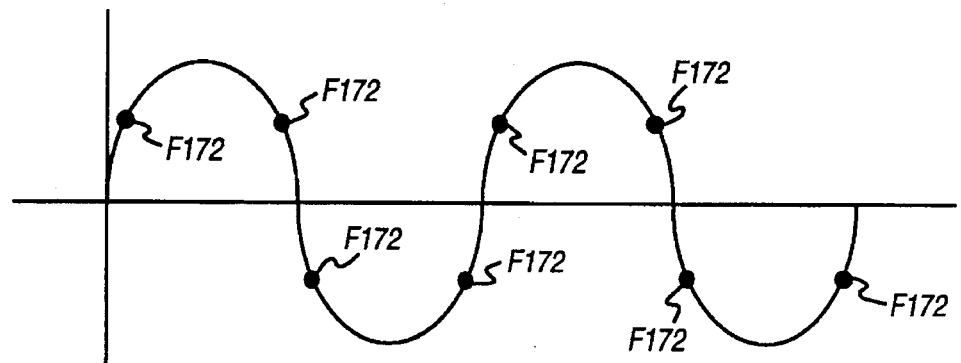
FIG. 11A, 11B and 11C show the technique of the present invention for sampling a sine wave to compute a frequency error control signal used to prevent harmonic lock in the PLL during acquisition.

To record the acquisition preamble onto the medium, the preamble generator 4 of FIG. 1 connects to the input of the precoder 10. A typical acquisition preamble, for example, is a 2T preamble of the form (1,1,0,0,1,1,0,0,1,1, . . . ) at the output 12 of precoder 10. A 2T preamble results in a substantially sinusoidal read back signal from the read head as shown in FIG. 11A. During acquisition, a phase error F123 and a frequency error F124, between the actual sampling frequency and the desired sampling frequency, are filtered by the loop filter F56 and the output F49 applied to a VFO F50. Due to the underdamped characteristics of the timing loop, the actual sampling phase will oscillate around the desired phase as it converges. After a predetermined amount of time, the phase and frequency error is assumed to be small enough to achieve efficient tracking of user data. At that point, the timing loop switches from acquisition to tracking mode.

Figure 4A:
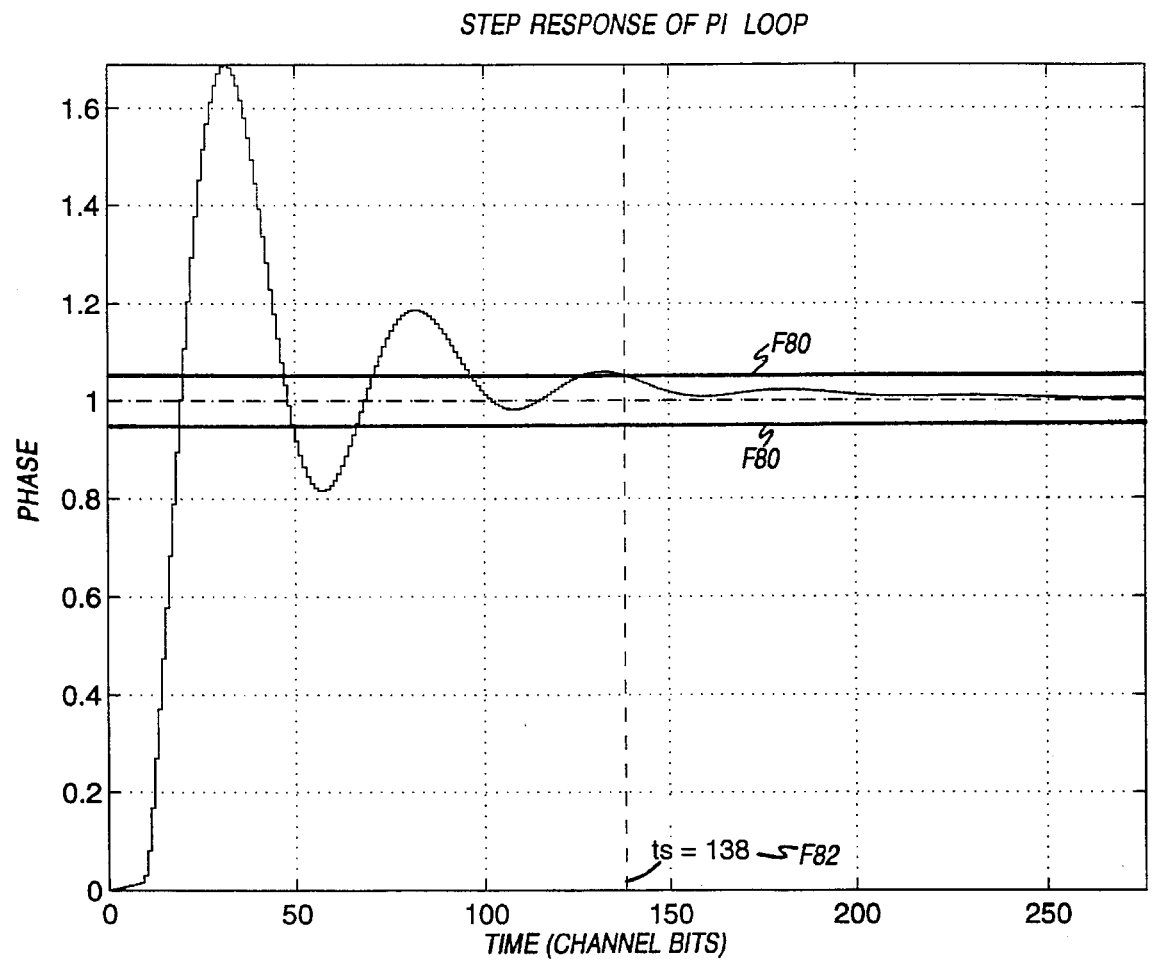
FIG. 4A and 4B show the closed loop step response of prior art PI timing recovery systems for two different gain settings.

In conventional timing recovery loops having a PI filter, the transient response is controlled by adjusting the proportional and integral terms. FIG. 4A shows the closed loop step response of a conventional timing loop for a particular PI setting. As shown in the figure, the output of the VFO F50 will overshoot the target phase and then oscillate as it converges. Eventually, the phase error will reach a predetermined tolerance F80. Therefore, the PLL is programmed to switch into tracking mode after an amount of time relative to the settling time. This is accomplished by programming a timer (not shown). For the particular PI terms in FIG. 4A, the settling time F82 is 138 channel bits (sampling periods).

Figure 4B:
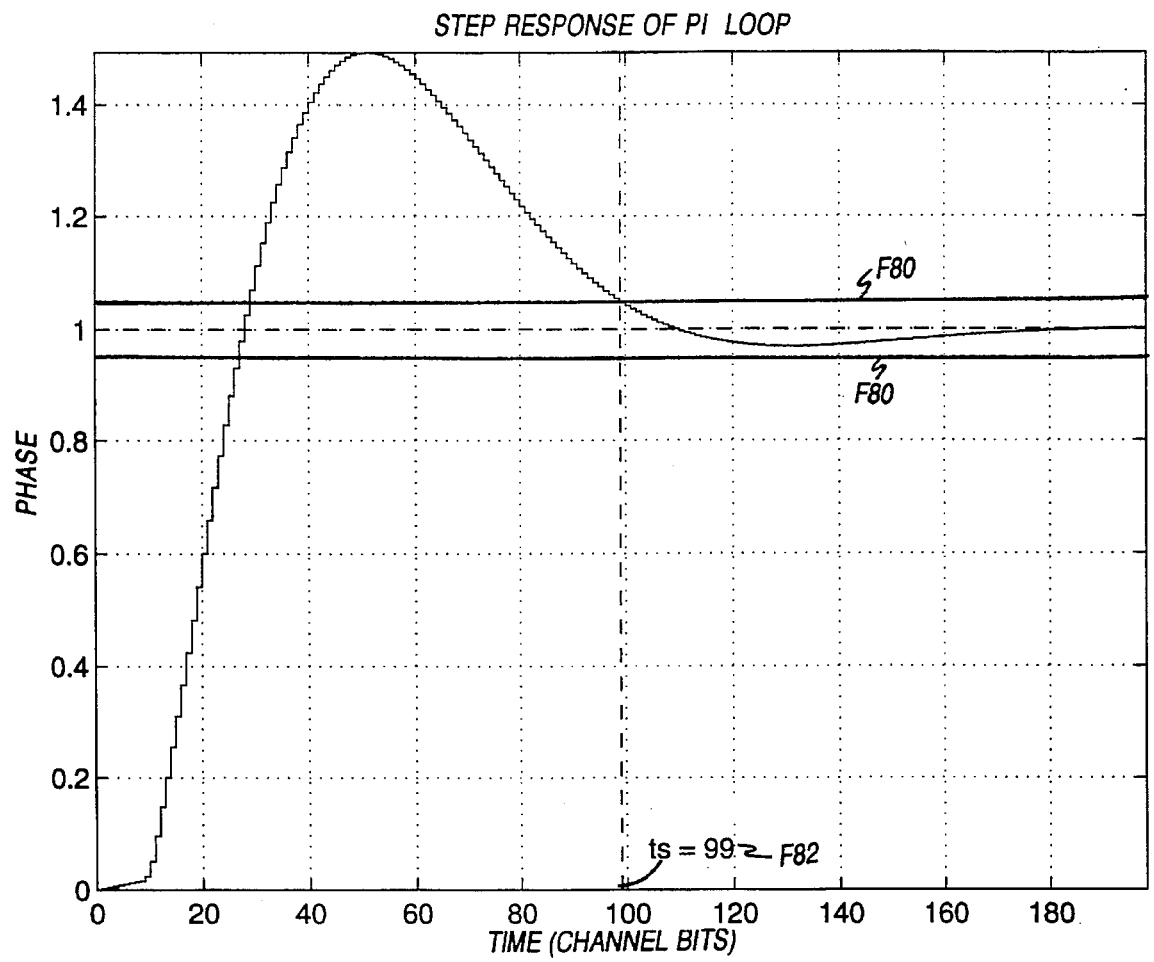

The settling time can be decreased by adjusting the PI terms to increase the phase margin and damping. For the closed loop step response shown in FIG. 4A, for example, this is accomplished by decreasing the gain. The phase margin for the step response of the PI loop in FIG. 4A is 25 degrees. By decreasing the proportional term from P=¼ to P=⅛, as shown in FIG. 4B, the phase margin is increased to 35 degrees and the settling time F82 reduced to 99 channel bits. Decreasing the gain, however, reaches a point of diminishing return and will eventually increase the settling time due to the decreased bandwidth.

PID Timing Loop Filter

Figure 5:
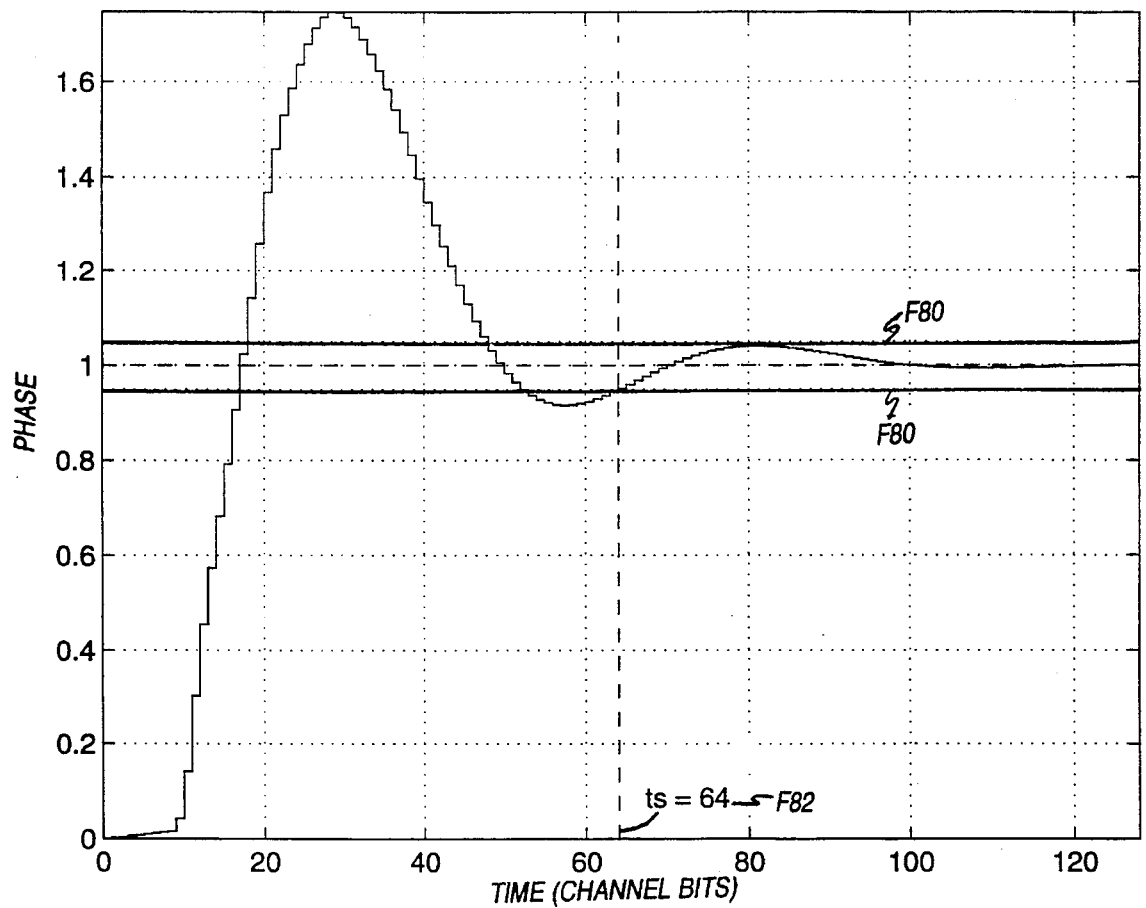
FIG. 5 shows the closed loop step response of the PID timing recovery system of the present invention.

The present invention provides greater control over the transient response of the timing loop by adding a difference path (to approximate a derivative term) to the loop filter. Thus, the loop filter of the present invention is a PID controller. The difference path increases the phase margin and damping at higher gains which results in a shorter settling time. FIG. 5 shows the closed loop step response for the timing loop of the present invention having a phase margin of 35 degrees and a settling time F82 of 64 channel bits. This decrease in settling time allows for a shorter acquisition preamble which, in turn, allows more user data to be stored on the medium.

Using a difference path to increase the phase margin and damping is also understood from the open loop frequency response. FIG. 6A and 6B show the open loop frequency response of the timing loop using a conventional PI loop filter. The cross-over frequency (0 db magnitude) is $10^6$ Hz F84 with a phase margin of 35 degrees F86. As shown in FIG. 7A and 7B, the difference path increases the phase margin to 45 degrees F86 for the same cross-over frequency of $10^6$ Hz F84. In other words, the phase margin and damping are increased without a reduction in bandwidth.

Figure 8:
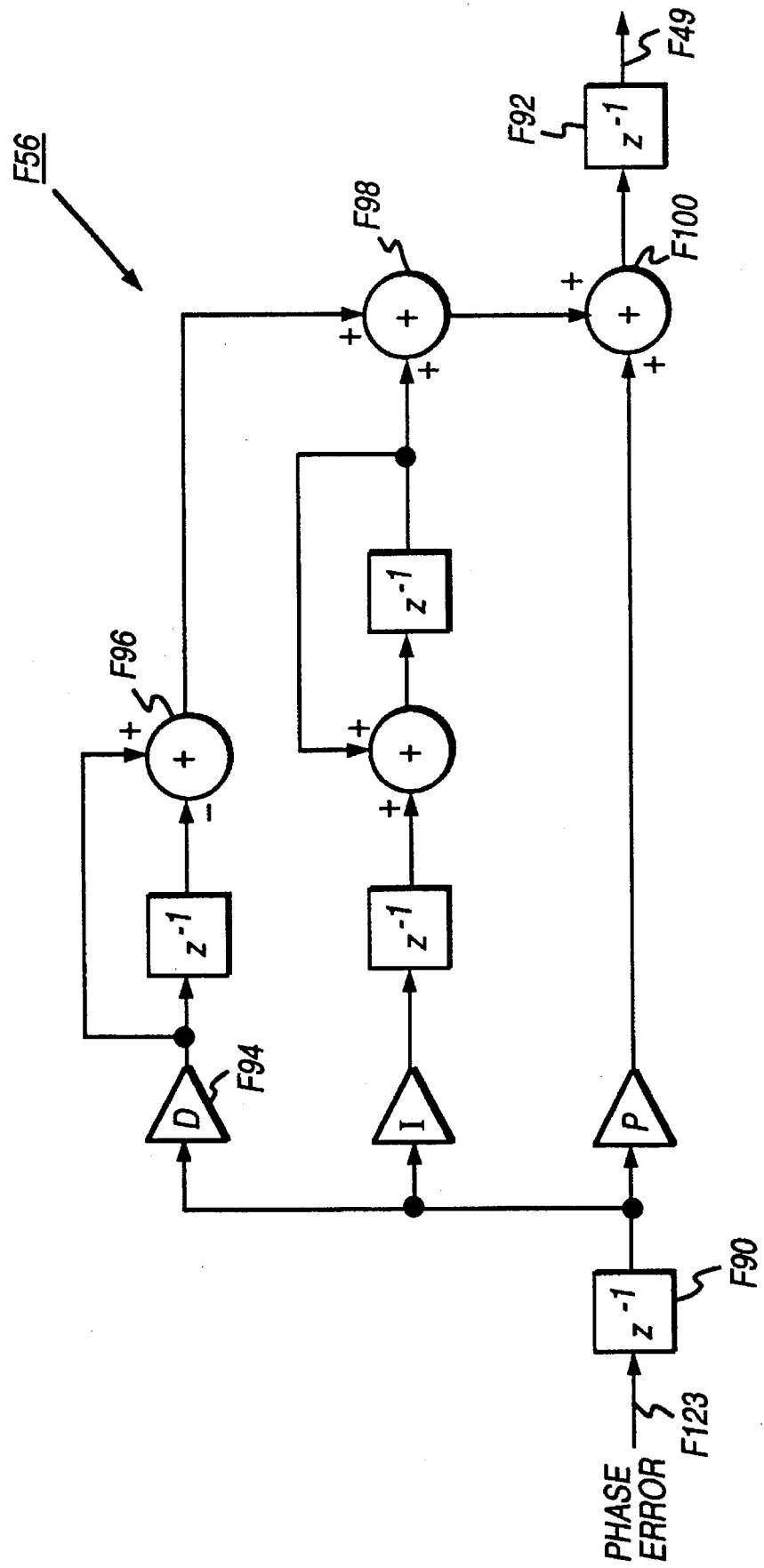
FIG. 8 shows the conventional structure for a PID discrete time filter and the corresponding impulse response.

FIG. 8 shows a conventional implementation of a PID filter, which has the following impulse response:

$$h(n)=P+D, -D, +I, +I, +I \ldots$$

An accumulation path with a transfer function of $I*Z^{-1}/(1-Z^{-1})$ approximates an integrating term, and a difference path with a transfer function of $D(1-Z^{-1})$ approximates a derivative term. The PID impulse response is of the form:

$$h(0) \neq h(1) \neq h(ss)$$

where h(ss) is the steady state integrating term.

There are many variations to the implementation shown in FIG. 8 which will provide the desired impulse response of the present invention. For instance, the integrating term could be delayed through more than two registers resulting in an impulse response of the form:

$$h(n)=P+D, -D, 0, 0 \ldots 0, I, I, I \ldots$$

Further, it may be advantageous to transform the filter of FIG. 8 into an alternative structure to reduce latency or improve the range and resolution of the filter coefficients.

Although the PID filter shown in FIG 8 is sufficient for the purpose of the present invention, it is not the preferred embodiment due to the undesired latency. The longest computation path between delay register F90 and delay register F92 is through a multiplier F94, a first adder F96, and a second adder F98 and a third adder F100. This computation delay between registers can be the limiting factor in the maximum sampling frequency and, consequently, the maximum speed the read channel can operate. A transformation of the PID loop filter results in a shorter computation path between delay registers which allows for a faster sampling frequency.

Figure 9A:
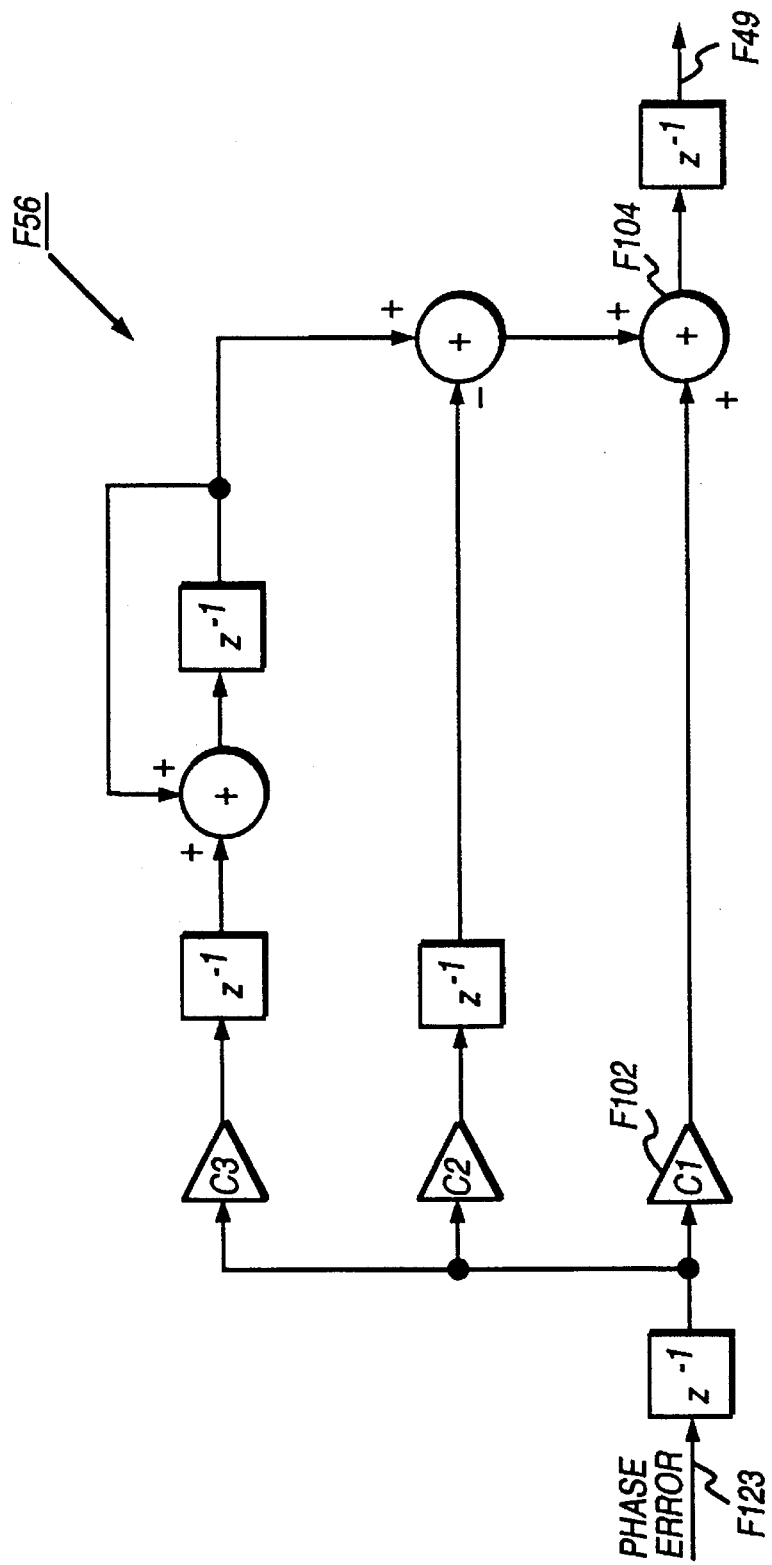
FIG. 9A and 9B show the PID structure for the preferred embodiments of the present invention and the corresponding impulse responses.

FIG. 9A shows a transformation of the conventional PID filter into a filter having a longest computation delay path through a multiplier F102 and an adder F104. The resulting impulse response for the transformed filter of FIG. 9A is:

$$h(n)=C1, -C2, C3, C3, C3 \ldots$$

where
$P+D=C1 \Rightarrow P=C1-D \Rightarrow P=C1-C2;$
$I=C3;$ and
$D=C2.$

Figure 10A:
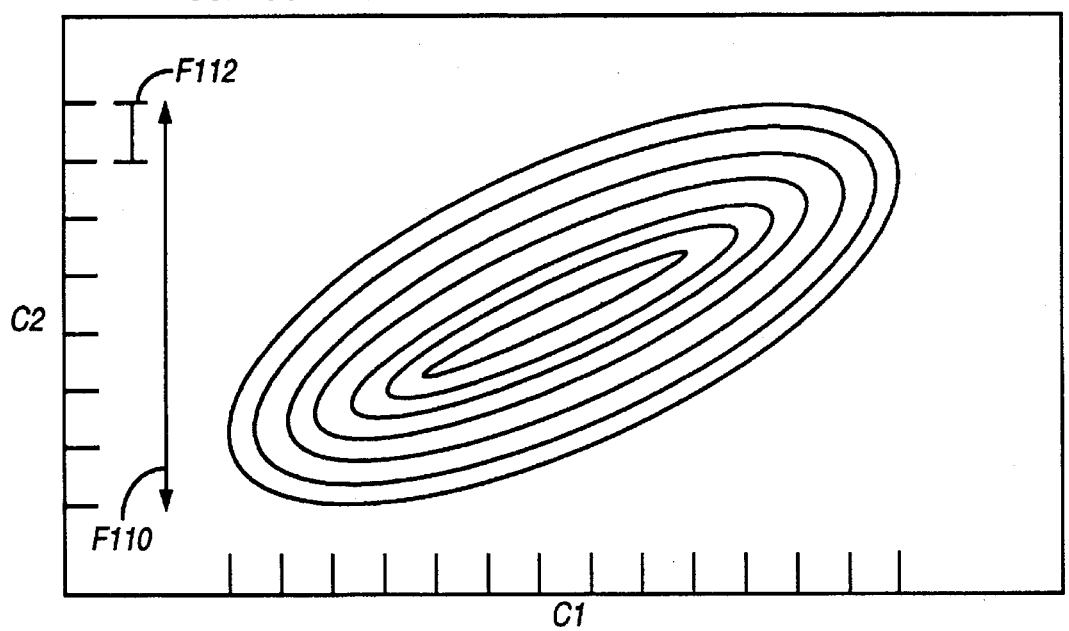
FIG. 10A is a contour plot of the loop filter coefficients versus the closed loop settling time.

Although a particular transformation in the loop filter can decrease the computation delay, it can also result in less than optimum range and corresponding resolution for the coefficients. FIG. 10A shows a contour plot of the closed loop settling time versus C1 and C2. The range F110 for the C2 coefficient of the transformed PID filter in FIG. 9A is unnecessarily wide, resulting in a coarse resolution F112.

Figure 9B:
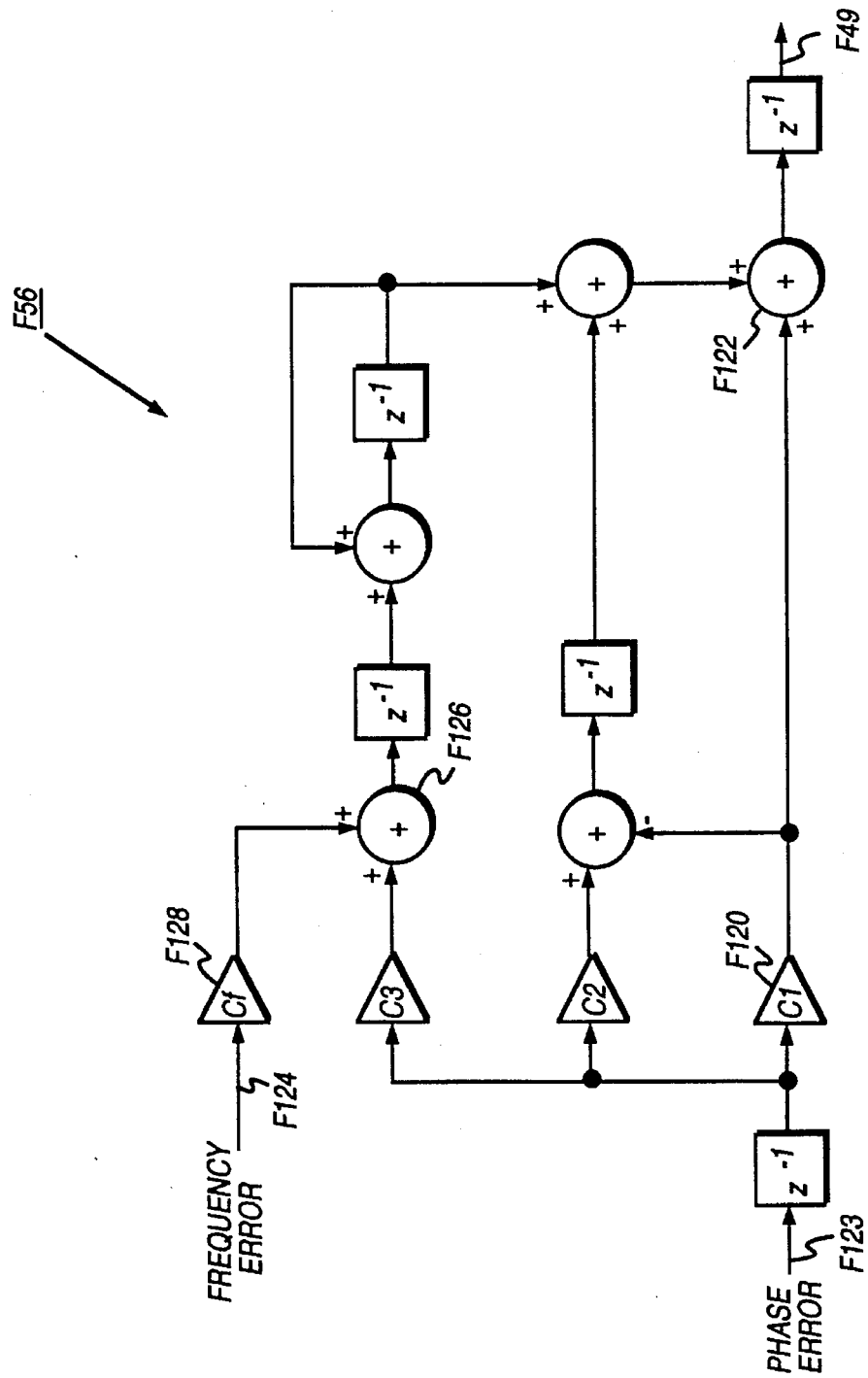
Figure 10B:
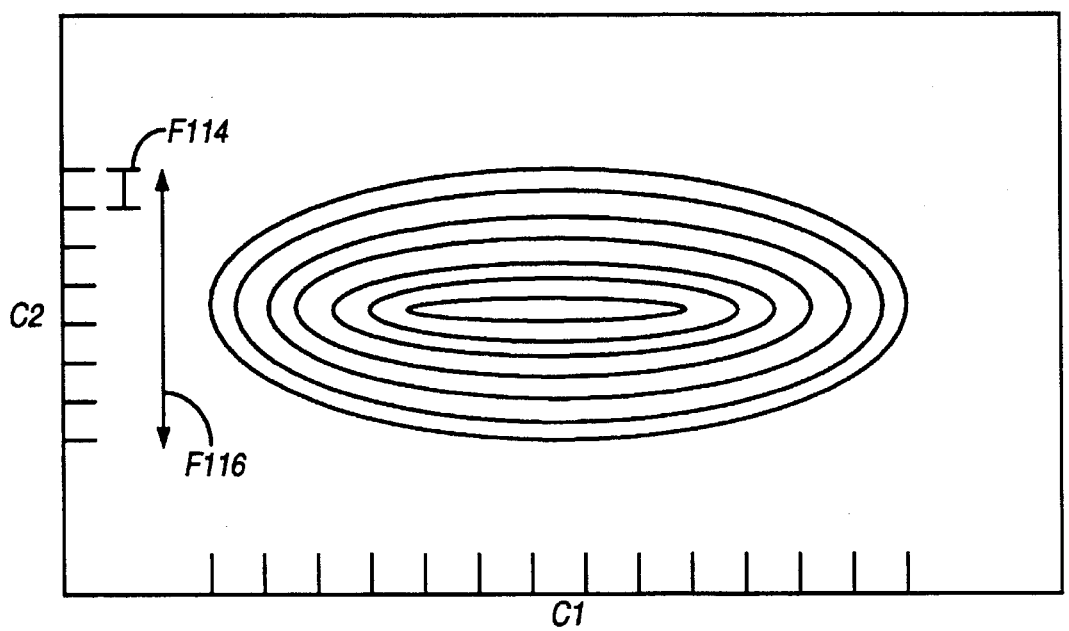
FIG. 10B is a contour plot after a transformation to improve the resolution of the coefficients.

A further transformation of the PID filter causes a rotation of the contour plot as shown in FIG. 10B. As a result, the necessary range F116 of C2 decreases, and the resolution F114 increases. FIG. 9B shows a transformation for the PID filter which achieves the desired rotation in the contour plot. The longest computation path between delay registers for this filter is still through one multiplier F120 and one adder F122. The resulting impulse response for the PID filter of FIG. 9B is:

$$h(n)=C1, C2-C1, C3, C3, C3 \ldots$$

where
$P+D=C1 \Rightarrow P=C1-D \Rightarrow P=C2;$
$I=C3;$ and
$D=C1-C2.$

The transformation that provides the desired range and corresponding resolution is determined heuristically by plotting the settling time over a plurality of transformations. The transformation that results in the desired contour plot while retaining a minimum computation delay is selected.

The PID filter in FIG. 9B also has a frequency control input signal F124 added into the accumulation path at adder F126 that changes the impulse of the filter to:

$$h(n)=C1, C2-C1, C3+Cf, C3+Cf, C3+Cf \ldots$$

The frequency error F124 locks the PLL to the nominal frequency during lock-to-reference, and it helps prevent harmonic lock during acquisition. After acquiring the preamble, the frequency error F124 is disabled by setting the coefficient Cf F128 to zero. To decrease the bandwidth and improve tracking performance, the derivative term of the filter is also disabled after acquisition by setting C2=C1.

Frequency Error

Figure 11B:
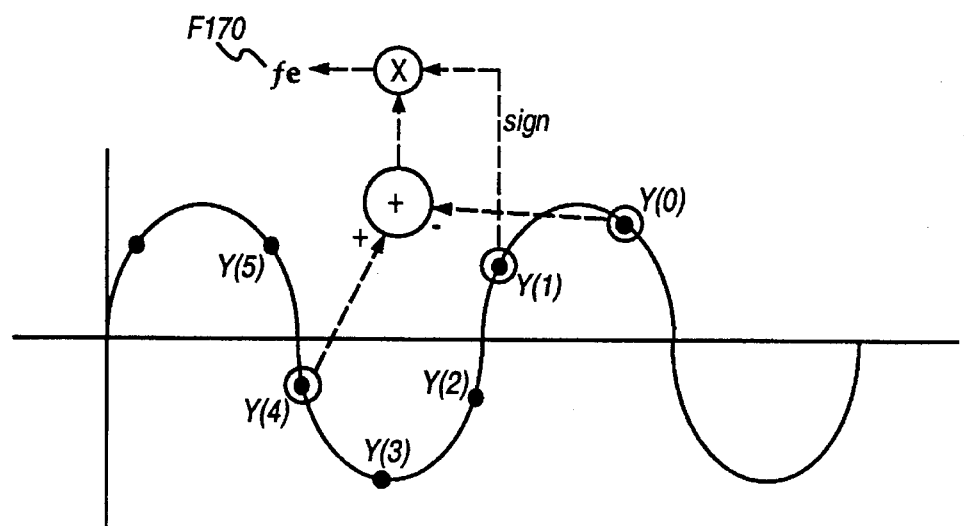
Figure 11C:
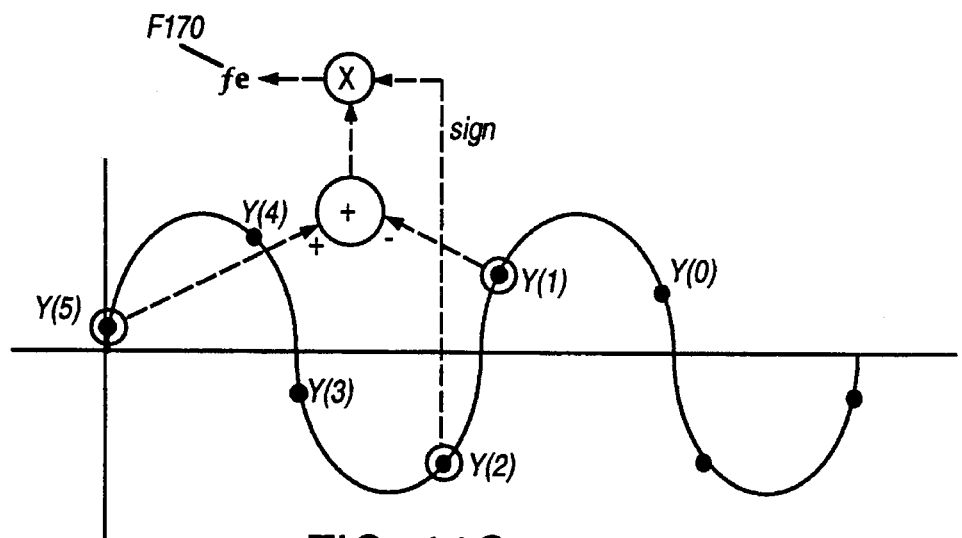

The method of the present invention for generating a frequency error to prevent harmonic lock conditions during acquisition is shown in FIG. 11A–11C. FIG. 11A shows the sampled F172 sinusoidal preamble. A frequency error fe F170 is computed utilizing the sample values Y(n) according to the following equations:

$$fe = \text{sign}(Y(1)) \cdot (Y(4) - Y(0)) \text{ if } |Y(1)| > |Y(2)|;$$

and $$fe = \text{sign}(Y(2)) \cdot (Y(5) - Y(1)) \text{ if } |Y(1)| < |Y(2)|.$$

As shown in FIG. 11A, if the sampling frequency is locked to the nominal sampling frequency, the frequency error fe F170 is zero. If the sampling frequency is too fast, as shown in FIG. 11B, the frequency error fe F170 will be negative, causing the sampling frequency to decrease. Conversely, if the sampling frequency is too slow, as shown in FIG. 11C, the frequency error fe F170 will be positive, causing the sampling frequency to increase.

Because the sample values Y(n) are subtracted to compute the frequency error fe F170, the PLL will lock to the correct frequency even if there is a DC offset in the reference sine wave. Additionally, this method has a higher sensitivity to the frequency error because the sample values Y(n) used to compute the frequency error fe F170 span at least a half a period of the reference sine wave. As a result, the PLL is less susceptible to channel and quantization noise.

The objects of the invention have been fully realized through the embodiment disclosed herein. Those skilled in the art will appreciate that the aspects of the invention can be achieved through various embodiments without departing from the spirit and scope of the invention. The particular embodiment disclosed is illustrative and not meant to limit the scope of the invention as appropriately construed by the following claims.

TABLE 1

| Channel | Transfer Function | Dipulse Response |
|---------|-------------------|------------------|
| PR4 | (1−D) (1+D) | 0, 1, 0, −1, 0, 0, 0, ... |
| EPR4 | (1−D) (1+D)$^2$ | 0, 1, 1, −1, −1, 0, 0, ... |
| EEPR4 | (1−D) (1+D)$^3$ | 0, 1, 2, 0, −2, −1, 0, ... |

We claim:

1. A sampled amplitude read channel for reading data from a magnetic medium by detecting digital data from a sequence of discrete time sample values generated by sampling pulses in an analog read signal from a magnetic read head positioned over the magnetic medium, comprising:

(a) a sampling device for sampling the analog read signal to generate the sequence of discrete time sample values; and (b) timing recovery for synchronizing the discrete time sample values to a rate of the recorded data, comprising a loop filter comprising:

(a) a first discrete time input connected to receive a phase error control signal;

(b) a Gain path for generating a proportional signal proportional to the magnitude of the phase error control signal;

(c) an accumulation path for generating an accumulated signal that is an approximation of the integral of the phase error control signal;

(d) a difference path for Generating a difference signal that is an approximation of the derivative of the phase error control signal; and (e) an adder for summing the proportional, accumulated, and difference signals into a discrete time output signal, wherein:

(a) the data stored on the magnetic medium comprises an acquisition preamble and user data;

(b) the loop filter has programmable coefficients; and (c) the coefficients of the loop filter are programmed for an acquisition mode when the read channel is reading the acquisition preamble, and the coefficients are programmed for a tracking mode when the read channel is reading the user data.

2. The sampled amplitude read channel recited in claim 1, wherein:

(a) the data stored on the medium comprises an acquisition preamble and user data; and (b) the difference path is disabled when the read channel is reading the user data.

3. The sampled amplitude read channel recited in claim 1, further comprising a second discrete time input connected to receive a frequency error control signal, wherein the frequency error control signal is added to the accumulation path.

4. The sampled amplitude read channel as recited in claim 4, wherein:

(a) the data stored on the medium comprises an acquisition preamble and user data; and (b) the frequency error signal is disabled when the read channel is reading the user data.

5. The sampled amplitude read channel as recited in claim 3, wherein:

(a) the data stored on the medium comprises an acquisition preamble and user data; and (b) the timing recovery is locked to a reference frequency before the preamble is processed by the read channel; and (c) the phase error signal is disabled when locking to the reference frequency.

6. The sampled amplitude read channel as recited in claim 1, the loop filter further comprising a plurality of programmable coefficients wherein a transfer function of the loop filter is adjusted by programming the coefficients.

7. The sampled amplitude read channel as recited in claim 1, the loop filter further comprising a C1, C2, and C3 coefficients responsive to the phase error, wherein an impulse response h(n) of the loop filter is:

h(n)=C1, −C2, C3, C3, C3, C3 . . . .

8. The sampled amplitude read channel as recited in claim 1, the loop filter further comprising a C1, C2, and C3 coefficients responsive to the phase error, wherein an impulse response h(n) of the loop filter is:

h(n)=C1, C2−C1, C3, C3, C3, C3 . . . .

9. The sampled amplitude read channel as recited in claim 3, the loop filter further comprising a C1, C2, and C3 coefficients responsive to the phase error, and a Cf coefficient responsive to the frequency error, wherein an impulse response h(n) generated as a sequence (1,0,0, . . . ) applied to the first and second discrete time inputs of the loop filter is:

h(n)=C1, C2−C1, C3+Cf, C3+Cf, C3+Cf, C3+Cf . . . .

10. In a sampled amplitude read channel, a method for reading data from a magnetic medium by detecting digital data from a sequence of discrete time sample values generated by sampling pulses in an analog read signal from a magnetic read head positioned over the magnetic medium, comprising the steps of:

(a) sampling the analog read signal to generate the sequence of discrete time sample values; and (b) synchronizing the discrete time sample values by:
   (a) generating a phase error control signal;
   (b) generating a proportional signal proportional to the magnitude of the phase error control signal;
   (c) generating an accumulated signal that is an approximation of the integral of the phase error control signal;
   (d) generating a difference signal that is an approximation of the derivative of the phase error control signal;
   (e) summing the proportional, integral, and derivative signals to generate a sampling control signal; and
   (f) programming a plurality of programmable coefficients;

wherein:
   (a) the coefficients are used to generate the proportional, accumulated and difference signals;
   (b) the coefficients are programmed in order to adjust the synchronizing process;
   (c) the magnetic medium is in the form of a disk;
   (d) the format of the data stored on the magnetic medium is in a plurality of concentric tracks on the disk;
   (e) the tracks have a higher data rate at the outer tracks than at the inner tracks; and
   (f) the values programmed into the plurality of coefficients correspond to a currently accessed track.

11. The method as recited in claim 10, wherein:
   (a) the sampled amplitude read channel operates in two modes, acquisition mode and tracking mode; and
   (b) the steps of generating the proportional signal, accumulated signal, and difference signal are adjusted through programmable settings;

further comprising the step of programming the settings with a first plurality of values for acquisition mode and with a second plurality of settings for tracking mode.

12. The method as recited in claim 10, wherein the sampled amplitude read channel operates in a tracking mode, further comprising the step of disabling the difference signal during tracking mode.

13. The method as recited in claim 10, the step of synchronizing further comprising the step of generating a frequency error control signal, wherein the accumulated signal is proportional to the integral of the frequency error control signal.

14. The method as recited in claim 10, wherein the sampled amplitude read channel operates in a lock-to-reference mode, further comprising the step of disabling the phase error signal during the lock-to-reference mode.

15. The method as recited in claim 13, wherein the sampled amplitude read channel operates in a tracking mode, further comprising the step of disabling the frequency error control signal during tracking mode.

16. The method as recited in claim 11, wherein the programmable settings are coefficients of a discrete time filter in a phase-locked-loop.

17. The method as recited in claim 16, wherein:
   (a) the coefficients correspond to a step response settling time for the phase-locked-loop; and
   (b) a repetitive method determines an impulse response for the discrete time filter that provides a predetermined range and resolution for the coefficients corresponding to a plurality of settling times.

18. The method as recited in claim 17, wherein the repetitive method comprises the steps of:
   (A) determining the plurality of settling times corresponding to a plurality of coefficient values;
   (B) transforming the discrete time filter to obtain a new impulse response;
   (C) repeating steps (A) and (B) at least once; and
   (D) selecting the impulse response according to the predetermined range and resolution for the coefficients.

19. A sampled amplitude read channel for reading data from a magnetic medium, said sampled amplitude read channel detects digital data from a sequence of discrete time sample values generated by sampling pulses in an analog signal from a magnetic read head positioned over the magnetic medium, comprising:
   (a) a phase error detector, responsive to the discrete time sample values, for generating a phase error signal;
   (b) a discrete time proportional, integral and difference filter, responsive to the phase error signal, for generating a control signal; and
   (c) a sampling device, responsive to the control signal, for sampling the analog signal to generate the discrete time sample values, wherein a transfer function H(Z) of the discrete time proportional, integral and difference filter is proportional to:
   $$H(Z)=P+D(1-Z^{-1})+I/(1-Z^{-1})$$
   where P, D, and I are predetermined non-zero values.

* * * * *

UNITED STATES PATENT AND TRADEMARK OFFICE
CERTIFICATE OF CORRECTION

PATENT NO : 5,572,558
DATED : November 5, 1996
INVENTOR(S) : Richard T. Behrens

It is certified that error appears in the above-identified patent and that said Letters Patent is hereby corrected as shown below:

Column 2, line 23: delete "which";

Column 11, line 56: replace "Gain" with --gain--;

Column 11, line 62: replace "Generating" with --generating--;

Column 12, line 22: replace "4" with --3--.

Signed and Sealed this

Sixth Day of May, 1997

Attest:

Attesting Officer

BRUCE LEHMAN
Commissioner of Patents and Trademarks